United States Patent
Hiblot et al.

(10) Patent No.: US 11,257,764 B2
(45) Date of Patent: Feb. 22, 2022

(54) INTEGRATED CIRCUIT WITH BACKSIDE POWER DELIVERY NETWORK AND BACKSIDE TRANSISTOR

(71) Applicant: IMEC vzw, Leuven (BE)

(72) Inventors: Gaspard Hiblot, Leuven (BE); Geert Van Der Plas, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/874,446

(22) Filed: May 14, 2020

(65) Prior Publication Data
US 2020/0373242 A1 Nov. 26, 2020

(30) Foreign Application Priority Data

May 23, 2019 (EP) .................................... 19176249

(51) Int. Cl.
*H01L 23/538* (2006.01)
*H01L 21/768* (2006.01)
(Continued)

(52) U.S. Cl.
CPC .... *H01L 23/5384* (2013.01); *H01L 21/76802* (2013.01); *H01L 21/823418* (2013.01);
(Continued)

(58) Field of Classification Search
CPC ............ H01L 23/5384; H01L 23/5286; H01L 21/76802; H01L 21/76898; H01L 27/088
See application file for complete search history.

(56) References Cited

U.S. PATENT DOCUMENTS 8,310,033 B2 * 11/2012 Jin .......................... H01L 24/05
257/621
8,344,496 B1 * 1/2013 White .................. H01L 23/5286
257/691
(Continued)

FOREIGN PATENT DOCUMENTS

EP          3 035 369 B1    6/2016
EP          3 324 436 A1    5/2018
WO    WO 2005/104233 A1    11/2005

OTHER PUBLICATIONS

Extended European Search Report, dated Nov. 11, 2019, issued in European Application No. 19176249.1.

*Primary Examiner* — Jaehwan Oh
*Assistant Examiner* — John M Parker
(74) *Attorney, Agent, or Firm* — Knobbe Martens Olson & Bear LLP (57) ABSTRACT

An integrated circuit (IC) chip that includes a semiconductor substrate including active devices on its front side, and at least part of a power delivery network (PDN) on its back side, is disclosed. In one aspect, the PDN includes a power supply terminal (Vdd) and a reference terminal (Vss) at the back of the IC. A plurality of TSV (Through Semiconductor Via) connections through the substrate bring the power to the front of the substrate. A field effect transistor is integrated at the back side of the substrate, and includes a source electrode, a drain electrode, and a gate electrode, which are contacted at the back side of the substrate. The IC further includes a gate control terminal for controlling the gate voltage. The transistor is coupled between the power supply terminal and one or more of the active devices of the IC.

11 Claims, 10 Drawing Sheets

(51) Int. Cl.
    *H01L 21/8234*     (2006.01)
    *H01L 23/50*     (2006.01)
    *H01L 29/66*     (2006.01)
    *H01L 29/78*     (2006.01)

(52) U.S. Cl.
    CPC ........ *H01L 23/50* (2013.01); *H01L 29/66477* (2013.01); *H01L 29/78* (2013.01)

(56) References Cited

U.S. PATENT DOCUMENTS

| | | | |
|---|---|---|---|
| 8,563,403 B1 * | 10/2013 | Farooq | H01L 21/76898 438/459 |
| 9,640,531 B1 * | 5/2017 | Or-Bach | H01L 21/76816 |
| 2006/0237815 A1 | 10/2006 | Kim et al. | |
| 2007/0018248 A1 | 1/2007 | Chuang et al. | |
| 2008/0100369 A1 | 5/2008 | Marshall et al. | |
| 2008/0179678 A1 * | 7/2008 | Dyer | H01L 21/84 257/351 |
| 2008/0296675 A1 * | 12/2008 | Yanagida | H01L 27/0694 257/334 |
| 2010/0224876 A1 | 9/2010 | Zhu | |
| 2012/0228709 A1 | 9/2012 | Anderson et al. | |
| 2015/0187642 A1 | 7/2015 | Batra et al. | |
| 2018/0294267 A1 | 10/2018 | Licausi et al. | |
| 2021/0043607 A1 * | 2/2021 | Or-Bach | H01L 24/08 |

* cited by examiner

INTEGRATED CIRCUIT WITH BACKSIDE POWER DELIVERY NETWORK AND BACKSIDE TRANSISTOR

CROSS-REFERENCE TO RELATED APPLICATIONS

This application claims foreign priority to European Patent Application No. 19176249.1, filed May 23, 2019, the contents of which are incorporated by reference herein in its entirety.

BACKGROUND

Technological Field

The disclosed technology is related to semiconductor processing, in particular to the production of devices which are capable of operating as power switches for the supply of power to the logic devices on an integrated circuit chip.

Description of the Related Technology

Some parts of an Integrated Circuit (IC) remain idle during long periods of time while the core is active, creating power dissipation due to static leakage, i.e., current leakage occurring when the transistors of the IC are not switching. One way to reduce the power consumption of the IC is to insert power gating transistors between well-defined blocks of the IC and the power delivery network (PDN) of the IC. Each block contains a number of active devices, such as CMOS transistors interconnected to form logic circuits. The power gating transistors are configured to cut off the power to an IC block when the block is not active, and to supply power to the block only when required. These power gating transistors are referred to as header or footer transistors. A header is coupled between a positive power supply voltage terminal of the network and the IC block. A footer transistor is coupled between a negative (or reference) terminal of the network and the IC block. The IC block may be separated from the power supply by a header, or a footer, or both. In presently known ICs, the header and/or footer transistors are incorporated in the front end of line portion of the IC, i.e., the portion that includes the active devices of the IC.

However, this solution presents drawbacks in terms of area and speed. The header and footer transistors need to be very large to have low resistance, since they are in series with the power rails of the PDN, hence representing a significant area consumption. If the ON resistance of the header/footer is not sufficiently low, the speed of the IC will be degraded. In addition, the header/footer transistors need to have a much smaller leakage ($I_{off}$) than the logic block in order to reduce the static power of the IC. Therefore, the $I_{on}/I_{off}$ ratio of the header/footer must be significantly larger than the $I_{on}/I_{off}$ ratio of the logic block transistors, which is not easy to achieve when they are built in the front end of line.

SUMMARY OF CERTAIN INVENTIVE ASPECTS

The disclosed technology aims to provide a solution to the above-described problems. This aim is achieved by an integrated circuit chip in accordance with the disclosed technology.

The disclosed technology is related to an IC chip that includes a semiconductor substrate including active devices on its front side, and at least part of a power delivery network (PDN) on its back side. The PDN includes a power supply terminal and a reference terminal at the back of the IC. A plurality of TSV (Through Semiconductor Via) connections through the substrate bring the power to the front of the substrate. According to the disclosed technology, a field effect transistor is integrated at the back side of the substrate, and includes a source electrode, a drain electrode and a gate electrode, which are contacted at the back side of the substrate. The IC further includes a gate control terminal for controlling the gate voltage. The transistor is coupled between the power supply and one or more of the active devices of the IC. More specifically, one of the source and drain electrodes is connected to the power supply terminal or the reference terminal through conductors of the PDN at the back of the substrate, while the other is connected to one or more active devices through conductors of the PDN and through one or more TSV connections. The backside transistor is particularly useful as a header or footer transistor that does not suffer from the above-described problems.

At the back side of the chip, the area problem is not an issue. Moreover, a transistor produced in accordance with the disclosed technology can be activated by a power management IC (PMIC) which feeds the back-side of the chip. The high-voltage carried by the PMIC and the different process conditions of the back-side transistor enables higher $I_{on}/I_{off}$ ratios compared to header/footer transistors integrated in the front end of line.

In particular, the disclosed technology is first related to an integrated circuit chip including:
- a semiconductor substrate, having a front side and a back side, the substrate including in a front portion of the substrate, a front end of line (FEOL) portion comprising a plurality of active devices,
- a back end of line (BEOL) portion, on top of the FEOL portion,
- a power delivery network (PDN), the PDN including one or more interconnect levels, a power supply terminal and a reference terminal, at least the power supply terminal and the reference terminal being located at the back of the substrate,
- a plurality of Through Substrate Via (TSV) connections through the substrate, the TSV connections being configured to enable the supply of power from the terminals at the back of the substrate to the active devices at the front of the substrate, characterized in that:
- the IC further includes at least one field effect transistor at the back side of the substrate, the transistor including a source region and a drain region, both located in the substrate, and a gate electrode between the source and drain regions, wherein the source and drain regions and the gate electrode are contacted at the back of the substrate,
- the PDN further includes a gate control terminal for controlling the gate voltage of the transistor, and
- one of the source and drain regions is electrically connected to the power supply terminal or the reference terminal through one or more conductors of interconnect levels of the PDN, the conductors being located at the back side of the substrate, while the other terminal is electrically connected to one or more active devices through one or more conductors of the PDN and through one or more TSV connections.

According to an embodiment, the gate electrode is buried in the substrate at the back thereof and separated from the source and drain regions by a dielectric layer.

In the latter embodiment, a plurality of conductors of the first PDN interconnect level may be buried in the substrate at the back thereof, wherein each of the plurality of conductors is uniform with one or more TSV connections.

According to an embodiment, the entire PDN is located at the back of the substrate, and wherein the FEOL portion includes a plurality of buried rails, which connect the active devices to the TSV connections, and wherein the buried rails may be connected through the TSV connections and through the PDN, to the power supply terminal or to the reference terminal.

According to an embodiment, the IC includes an array of the buried rails which are alternately connected to the voltage supply terminal and to the reference terminal, and wherein the transistor is integrated in the space between two rails.

According to an embodiment, the IC includes a block of active devices coupled to the PDN through the TSV connections, and wherein the field effect transistor is configured to act as a header or footer transistor for allowing or interrupting the supply of power to the IC block.

According to an embodiment, the IC includes both a header and a footer transistor for allowing or interrupting the supply of power to the IC block.

The disclosed technology is furthermore related to a method for producing an integrated circuit chip including:
  providing a process wafer, including a first layer of semiconductor material on its surface,
  implanting dopant elements into the first layer of semiconductor material, to form the source and drain regions of a field effect transistor, and if necessary, to form a well region into which the source and drain regions are embedded,
  depositing a further layer of the semiconductor material on the first layer, to obtain the substrate on the process wafer, consisting of the first layer, including the source and drain regions, and the further layer,
  producing the FEOL portion in a front portion of the substrate, at the side opposite from the process wafer,
  producing the BEOL portion on top of the FEOL portion,
  removing the process wafer, to thereby expose the source and the drain regions at the back of the substrate,
  etching openings from the back of the substrate and through the substrate for the TSV connections,
  depositing a dielectric liner on the sidewalls and the bottom of the openings for the TSV connections,
  by a maskless etching process, removing the dielectric liner from the bottom of the TSV openings,
  producing an electrically conductive layer on the substrate, filling the TSV openings to thereby form the TSV connections,
  planarizing the conductive layer,
  producing the PDN or the remainder of the PDN, including the power supply and reference terminals,
the method further including forming source and drain electrodes on the exposed source and drain regions and forming a gate electrode and gate dielectric at the back of the substrate.

In the above-described method, the order in which the additional steps are performed relative to each other and to the other steps is not determined. The step of forming the gate electrode and gate dielectric may also be performed in a number of sub-steps, some of which may be done simultaneously with other steps of the method.

According to an embodiment, the method further includes the following, performed after exposing the source and drain regions at the back of the substrate and before etching the openings for the TSV connections:
  etching an opening at the back of the substrate between the source and drain regions, two sidewalls of the opening being directly adjacent the source and drain regions, followed by:
  depositing a dielectric layer conformally on the backside of the substrate,
wherein the formation of the gate electrode and gate dielectric is realized as follows:
  the maskless etching process thins the conformal dielectric layer on the bottom of the opening between the source and drain regions, so as to obtain a thin dielectric layer on the bottom of the opening, the layer being thinner than the dielectric layer that remains on the sidewalls of the opening,
  the electrically conductive layer fills the opening between the source and drain regions,
  the planarization of the conductive layer forms the gate electrode, separated from the substrate by the dielectric layer on the sidewalls of the opening and by the thin dielectric layer on the bottom of the opening, that thereby forms the gate dielectric of the transistor.

According to an embodiment, the method further includes etching of additional openings at the back of the substrate, simultaneously with the etching of the opening between the source and drain regions, and:
  the TSV openings are etched through the bottom of the additional openings,
  the conformal dielectric layer and the liner are deposited also on the bottom and sidewalls of the additional openings,
  the maskless etching process results in a thin dielectric layer on the bottom of the additional openings while obtaining a thicker dielectric layer on the sidewalls of the additional openings,
  the conductive layer fills the TSV openings as well as the additional openings, thereby forming conductors of the first PDN level, which are buried in the substrate and which are uniform with one or more TSV connections, the conductors being isolated from the substrate by the thin dielectric layers at the bottom of the additional openings and by the thicker dielectric layers on the sidewalls of the additional openings.

According to an embodiment of the method, the FEOL portion includes a plurality of buried rails, wherein the TSV connections and the PDN may connect each of the rails to either the voltage supply terminal or the reference terminal.

DETAILED DESCRIPTION OF CERTAIN ILLUSTRATIVE EMBODIMENTS

An embodiment of the disclosed technology takes advantage of a prior development, which is the production of buried power rails integrated in the front end of line portion of the IC fabrication process. Reference is made to a previous patent application by the applicant, published as European Patent Publication No. EP3324436A1, and incorporated herein by reference in its entirety. In implementations of the disclosed technology, buried power rails are connected by TSV connections, to a power delivery network (PDN) that is located entirely on the backside of the chip. According to one embodiment, one or more field effect transistors are integrated in this configuration, at the back of the semiconductor substrate that carries the active devices of the chip at its front, and the PDN at its back. The application of these transistors as a header or footer transistor will be described in detail hereafter. Based on this description, other uses will become apparent to the skilled person.

Figure 1:
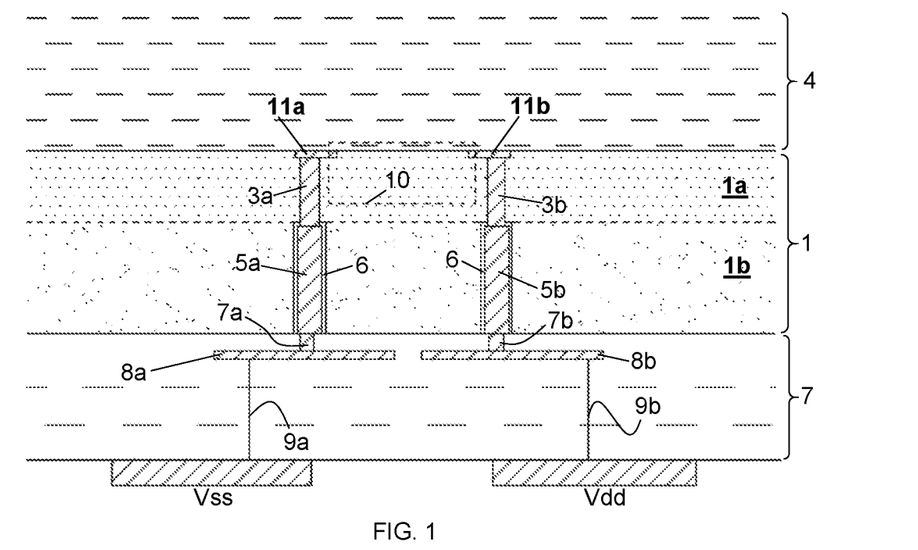
FIG. 1 illustrates a section of a prior art integrated circuit chip, wherein a block of active devices on the chip is supplied with power through a power delivery network arranged on the backside of the IC.

As a point of reference, with respect to which the disclosed technology will be described, FIG. 1 illustrates a section of a prior art IC, including the power supply to an IC block 10, when the entire power delivery network is present on the backside of the IC, as described, for example, in European Patent Publication No. EP3324436A1. No header or footer transistors separate the block 10 from the power supply. The drawing makes abstraction of a number of well-understood concepts, and shows only technical details to assist in understanding the context of the disclosed technology. The IC includes a silicon substrate 1 which may have a thickness in the order of 0.5 to 1 micrometer. For the sake of explaining the disclosed technology, the substrate is defined as a p-doped substrate. The substrate includes a front end of line (FEOL) portion 1a and a bulk Si portion 1b. The FEOL portion 1a includes a high number of active devices, such as CMOS transistors, processed according to any suitable technology, such as finFET or the like. None of these devices are shown in detail. On top of the FEOL portion 1a is the back end of line portion (BEOL) 4, not shown in detail but would be understood by a skilled reader. The BEOL includes multiple interconnect levels for realizing circuit interconnects between the active devices in the FEOL. The interconnect levels include interconnect vias and conductors embedded in a dielectric material.

The FEOL portion 1a further includes multiple buried power rails 3a, 3b formed of a conductive material, usually a metal such as copper. Example functions and production methods for obtaining the buried rails are described in European Patent Publication No. EP3324436A1. The buried rails connect the active devices of the FEOL portion 1a to the back of the substrate, through TSV connections 5a, 5b which are preferably metal connections, isolated from the silicon by a liner 6 which may be formed of silicon oxide. Only two rails 3a, 3b and two TSV connections 5a,5b are shown. As described in one example in European Patent Publication No. EP3324436A1, multiple rails can be produced at regular intervals, alternately Vss-coupled and Vdd-coupled, while multiple TSV connections are arranged for connecting the rails to the power delivery network 7 at the back of the substrate 1. Some of the buried rails may also be isolated by a liner (not shown) from the surrounding semiconductor material, depending on the layout of the FEOL portion 1a. The TSV connections 5a and 5b need not necessarily be located in the same vertical plane, but for the sake of explaining the disclosed technology, they are drawn in this way. According to one design, the TSV connections are arranged in a pattern in which there is a shift between the position of the TSV connections contacting two adjacent rails, as described in European Patent Publication No. EP3324436A1.

The PDN 7 is an interconnect structure similar to the BEOL portion 4, through which the buried rails 3a, 3b are coupled to a supply voltage terminal (Vdd) or a reference terminal (Vss) which are accessible at the back of the IC. Interconnect vias 7a, 7b and conductors 8a, 8b of the first PDN level are shown, which are connected respectively to the TSV connections 5a and 5b. The remainder of the PDN is not shown in detail. Connections 9a, 9b symbolize the further interconnect routing through the PDN from the respective conductors 8a, 8b to the terminals Vss and Vdd.

The IC block 10 includes multiple interconnected active devices not shown in detail. Local interconnects 11a and 11b connect the block 10 respectively to the rails 3a and 3b. The voltage supply to the block 10 takes place through the first buried rail 3a and TSV 5a coupled to Vss and through the second buried rail 3b and TSV 5b coupled to Vdd. The block 10 is not necessarily coupled to Vss by a single TSV 5a, but it could be coupled to Vss through several TSV connections, for example a row of TSV connections perpendicular to the plane of the drawing, and all connected to the conductor 8a, which may extend in the direction perpendicular to the plane of the drawing. The same is true for the connection of the block 10 to Vdd.

As stated above, the IC block 10 in FIG. 1 is not separated from the power supply by a header or footer transistor. The prior art solution to this would be to incorporate one or both of these transistors in the FEOL portion 1a. According to the disclosed technology, the header and/or the footer transistor is incorporated at the back of the substrate, as illustrated in FIG. 2, which shows the IC block 10 provided with a footer transistor, in accordance with an embodiment of the disclosed technology.

According to this embodiment, the first level of the PDN 7 is partially buried in the substrate, at its backside, and one buried conductor is processed so as to serve as the gate electrode of the backside footer transistor 100 according to the disclosed technology. In addition, doped regions are provided on either side of the gate electrode, for creating the source and drain of the transistor, and a well or optionally threshold voltage shifting implant is provided above the gate electrode and separated therefrom by a gate dielectric.

Figure 2:
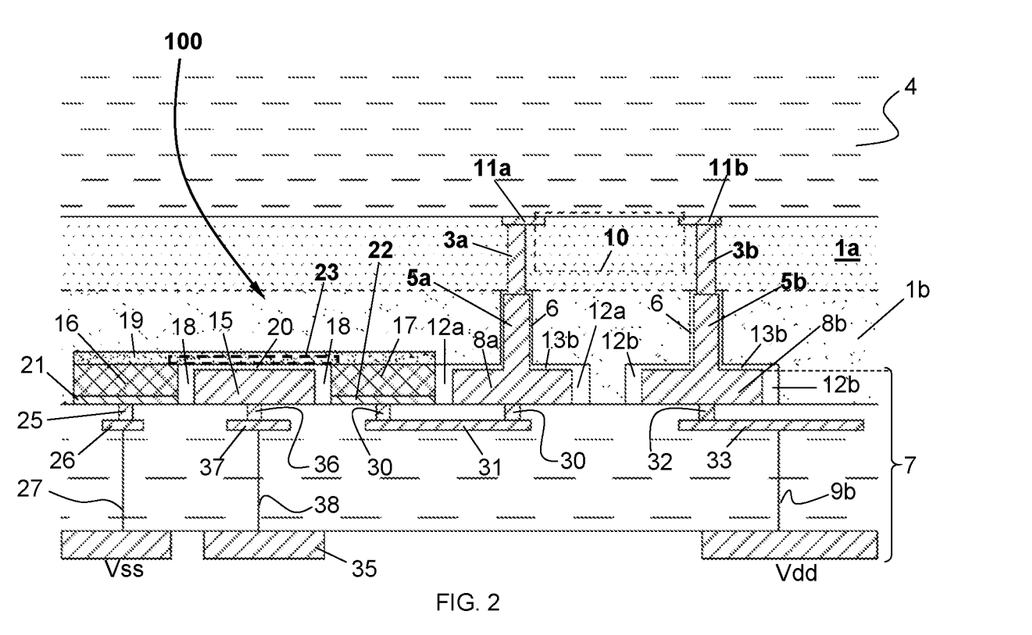
FIG. 2 illustrates the IC of FIG. 1, further provided with a footer transistor in accordance with the disclosed technology, and wherein the conductors of the first level of the power delivery network (PDN) are buried in the semiconductor substrate.

With reference to FIG. 2, metal conductors 8a and 8b of the first PDN level are now buried in the substrate and uniform with the respective TSV connections 5a and 5b. These conductors 8a and 8b are isolated from the substrate by lateral oxide layers 12a and 12b, and further by thin horizontal oxide layers 13a and 13b. The gate electrode 15 of the footer transistor is a metal contact pad equally buried in the substrate 1 at its backside. N-doped regions 16 and 17 are present on either side of the gate electrode 15, and separated from the gate by an oxide 18. The n-doped regions 16 and 17 are the source and drain regions of the footer transistor. Extending from the source to the drain is a p-doped region 19 having a higher dopant density than the substrate 1 and separated from the gate 15 by a thin oxide layer 20 which functions as the gate oxide of the transistor, and which is thinner than the oxide 18 separating the gate 15 from the source and drain regions 16 and 17. The region 19 having a higher dopant density is optional and may be implemented for shifting the threshold voltage of the transistor. When the transistor is in the ON state, charge carriers move in a channel region 23 between the source and drain regions 16 and 17 and immediately adjacent the gate electrode 20. When the p-doped region 19 is not included, the source and drain regions 16 and 17 could extend further down into the substrate, beyond the gate electrode 15.

As a consequence of an example production process applied for producing the footer transistor of FIG. 2 (described in further detail below), the gate electrode 15 and the conductors 8a and 8b can have the same thickness. For the same reason, the oxide layers 12a, 12b and 13a, 13b can have the same thickness as the respective layers 18 and 20.

Source and drain electrodes 21 and 22, which can be formed of a metal silicide, are provided on the source and drain regions 16 and 17 at the back surface of the substrate 1. The source electrode 21 of the footer is coupled to Vss through a via 25 and a conductor 26 of the PDN and through one or more further connections of the PDN symbolized by the line 27. The drain electrode 22 of the footer is coupled to the IC block 10 through vias 30 and conductor 31 of the PDN, which connect the drain electrode 22 to the conductor 8a. The TSV or TSV connections 5a are thus no longer directly coupled to Vss. Instead, they are coupled to Vss via the footer transistor 100.

The other buried rail 3b and TSV 5b are coupled to Vdd through a via 32 and a conductor 33 of the PDN and through one or more further connections of the PDN symbolized by the line 34. The gate electrode 15 is connected to a dedicated gate control terminal 35 at the back of the IC, through vias and conductors of the PDN, symbolized by reference numerals 36, 37 and 38. Through the gate control terminal 35, the footer transistor 100 can be switched on or off, thereby coupling or decoupling the IC block 10 to or from the power supply.

Figure 3:
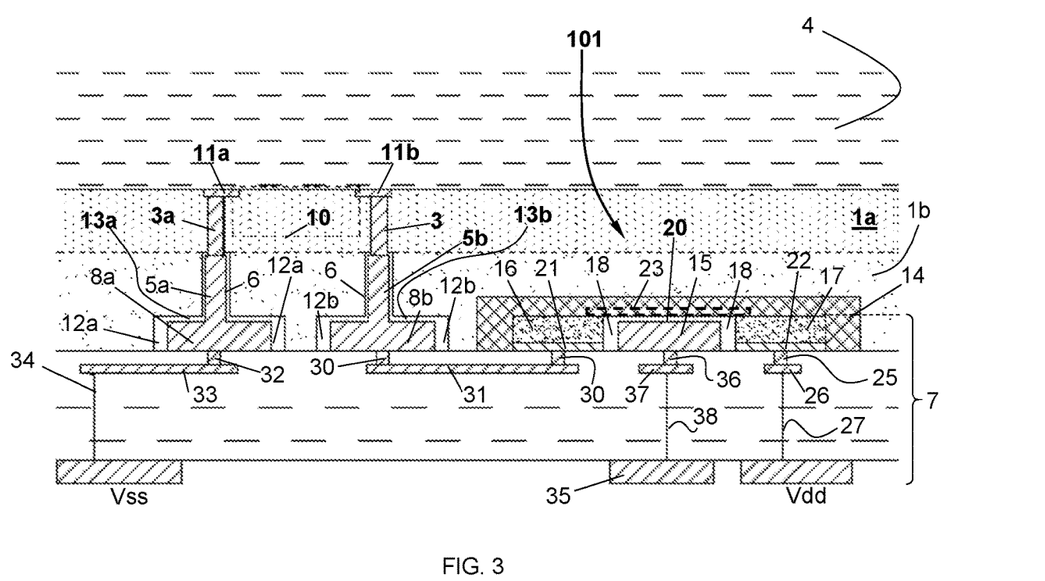
FIG. 3 illustrates the IC of FIG. 1, further provided with a header transistor in accordance with the disclosed technology, and wherein the conductors of the first level of the PDN are buried in the semiconductor substrate.
Figure 4:
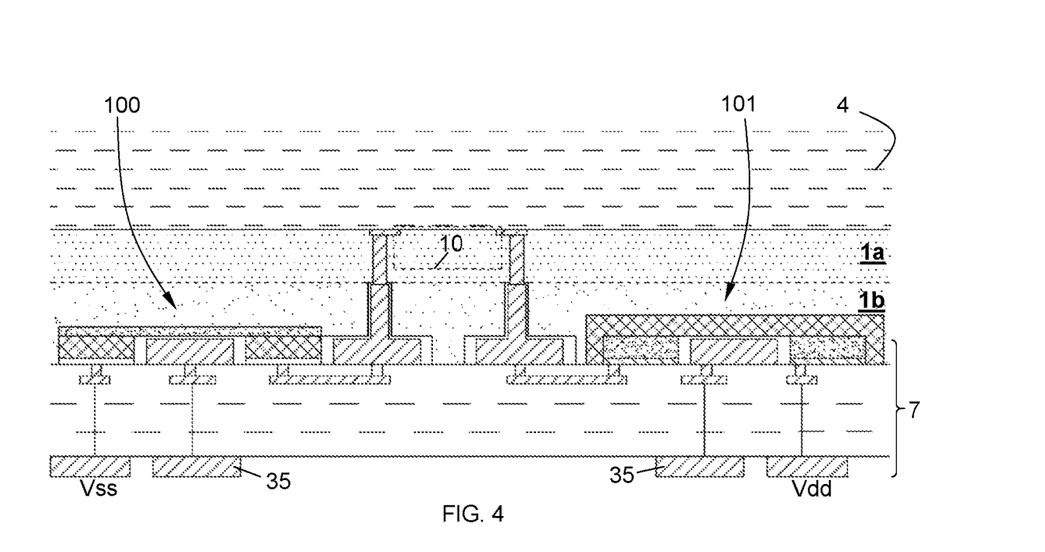
FIG. 4 illustrates the IC of FIG. 1, provided with a footer and a header transistor in accordance with the disclosed technology.

FIG. 3 shows an embodiment wherein a p-type header transistor 101 is incorporated at the back of the IC, between the IC block 10 and the Vdd terminal at the back, in an analogue way as the footer shown in FIG. 2. The various components are indicated with the same reference numerals, and the operation of the header transistor 101 is the same as the footer transistor of FIG. 2. As the transistor is a p-type transistor, an n-well 14 is provided at the back of the substrate 1, while the source and drain regions 16 and 17 are p-doped regions. A channel region 23 equivalent to the channel region in FIG. 2 is now defined as a portion of the n-well 14 immediately adjacent the gate oxide 20. Here also, the source and drain regions 16 and 17 could extend further down into the substrate, beyond the gate electrode 15. FIG. 4 shows an embodiment including both a footer transistor 100 and a header transistor 101.

All of the header and footer transistors described above are enhancement mode transistors, but this is not a required feature of the disclosed technology. The transistor could be a depletion mode transistor instead of enhancement mode. An n-type depletion mode transistor may, for example, be obtained by implanting the area 19 in FIG. 2 with n-type dopants instead of p-type.

Figure 5:
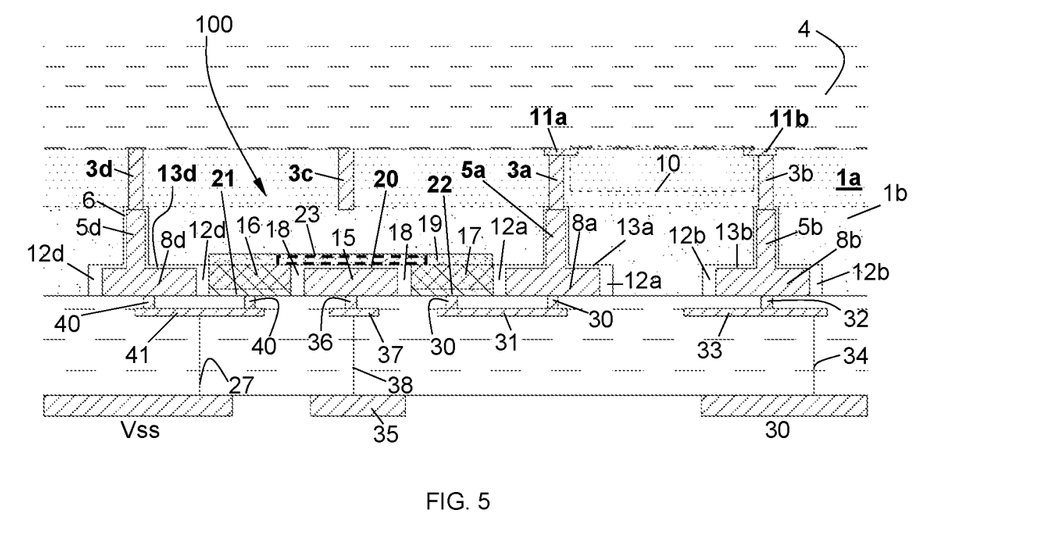
FIG. 5 illustrates a footer transistor according to the disclosed technology, integrated in the space between two Vss-connected buried rails.

FIGS. 2 to 4 show only two rails 3a and 3b, but in a standard design, there is a plurality of alternately Vss- and Vdd-coupled, regularly spaced rails. According to an embodiment, the transistor is integrated at the back side, taking into account the spacing between the rails and TSV connections. Such an embodiment is illustrated in FIG. 5 for the case of the footer transistor 100. The rails 3a and 3b are part of an array of regularly spaced rails, further including a Vdd coupled rail 3c and a Vss coupled rail 3d, the latter being connected through one or more TSV connections 5d to a conductor 8d of the first PDN level, isolated from the substrate by oxide layers 12d and 13d. The Vdd coupled rail 3c is connected to one or more TSV connections and conductors (not shown) outside the plane of the drawing. The transistor is now integrated in the space between the Vss-coupled rails 3a and 3d. As shown in the drawing, the source 16 may be coupled to the conductor 8d through vias 40 and conductor 41 of the PDN. The header transistor 101 of FIG. 3 may be integrated in a regular array of buried rails in an analogue way.

Figure 6:
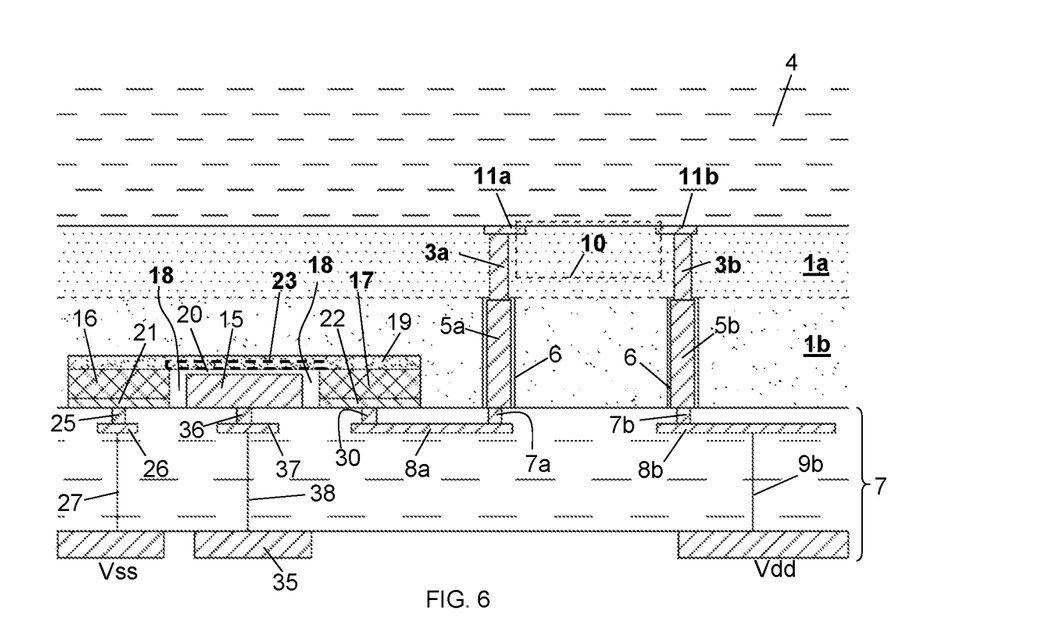
FIG. 6 illustrates an alternative design of the footer transistor of the disclosed technology, wherein only the gate electrode is buried in the substrate.
Figure 7:
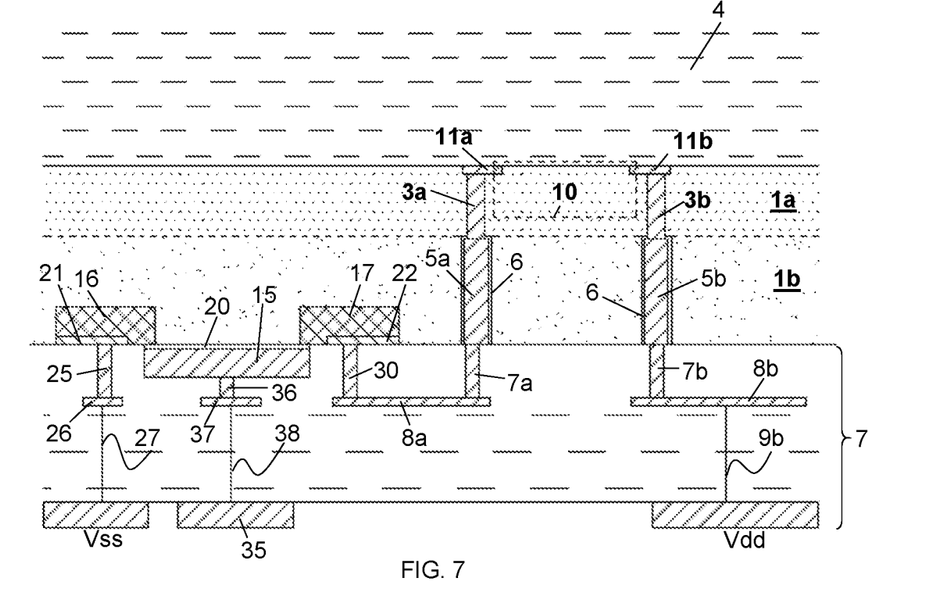
FIG. 7 illustrates another alternative embodiment of the disclosed technology, wherein the gate electrode is produced on top of the back surface of the substrate.

The disclosed technology is not limited to the above-described embodiment wherein the conductors 8a, 8b, 8c and 8d of the first level of the PDN are buried in the substrate 1. Possibly, only the gate electrode 15 is buried in the substrate, and the first level of the PDN is produced in accordance with previous technologies, i.e. on the back surface of the substrate 1. This embodiment is illustrated in FIG. 6, for the case of the footer transistor 100. The first level of the PDN 7 is now formed by the vias 25, 36, 30, 7a and 7b and the conductors 26, 37, 8a and 8b. According to yet another embodiment illustrated in FIG. 7, the gate 15 is produced on top of the back surface of the substrate 1. In this case, the gate oxide is an oxide layer 20 on top of the substrate 1. The gate electrode 15 is now embedded in the dielectric of the PDN 7, which is connected to the gate 15, and to the source and drain regions 16 and 17 in the same way as in the previous embodiment.

The disclosed technology is not limited to the use of the transistor integrated at the back of the substrate as a header or footer transistor, i.e., a transistor for allowing or interrupting the power supply to an IC block 10. The transistor according to the disclosed technology could be implemented, for example, as part of a low drop-out (LDO) voltage converter, a charge pump circuit, or high-voltage I/O transistor. Two transistors according to the disclosed technology could be used as the pull-up and pull-down transistors of a buck converter circuit integrated in the IC.

Also, the disclosed technology is not limited to an IC including buried power rails 3a to 3d. Without the buried power rails, it is possible to produce at least the voltage supply terminal and the reference terminal on the backside of the substrate, while at least one level of the PDN is on the front side, between the FEOL and the BEOL. TSV connections through the substrate then connect the terminals to the PDN. In this case, a field effect transistor in accordance with the disclosed technology may be integrated on the substrate's backside in the same way as described above, and connected to the Vss and Vdd terminals through conductors of the PDN located at the back side of the substrate.

Figure 8A:
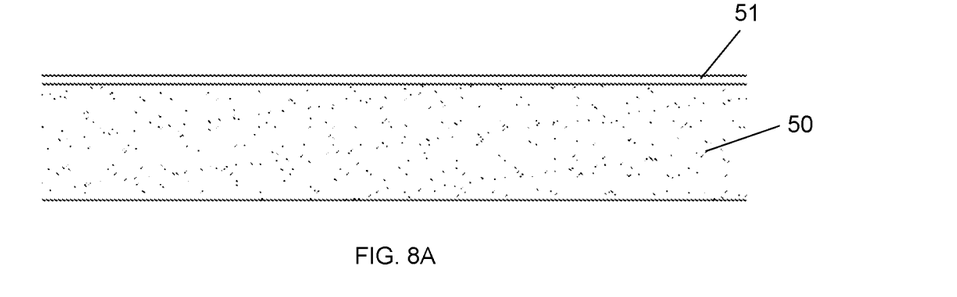
FIGS. 8A to 8P illustrate steps of a method for producing the IC according to FIG. 2.
Figure 8B:
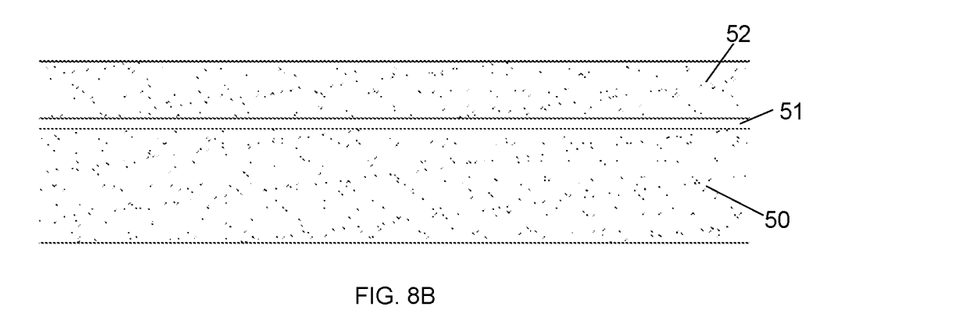
Figure 8C:
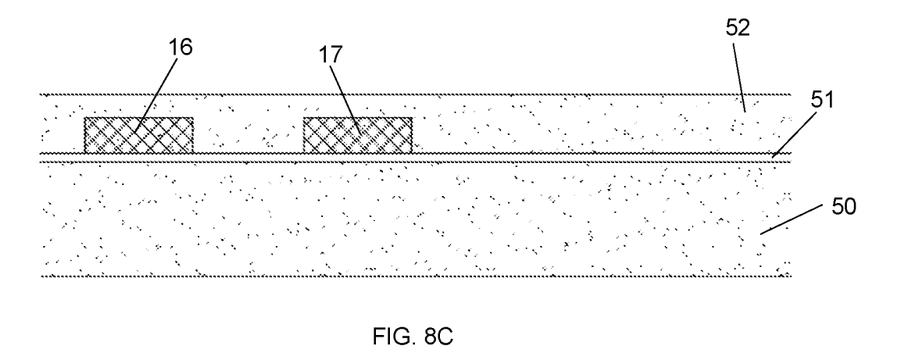
Figure 8D:
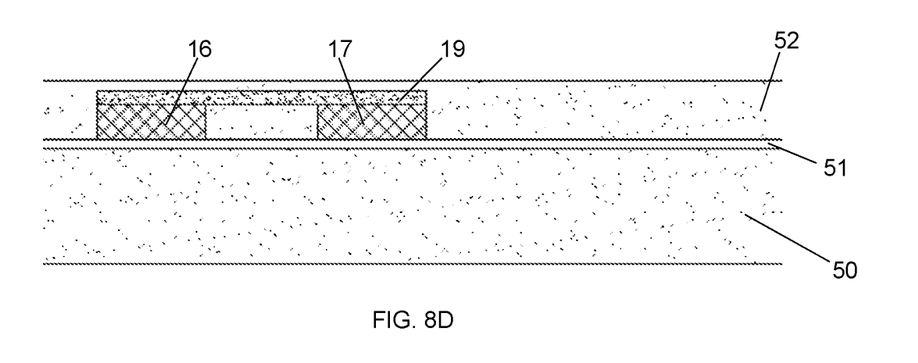
Figure 8E:
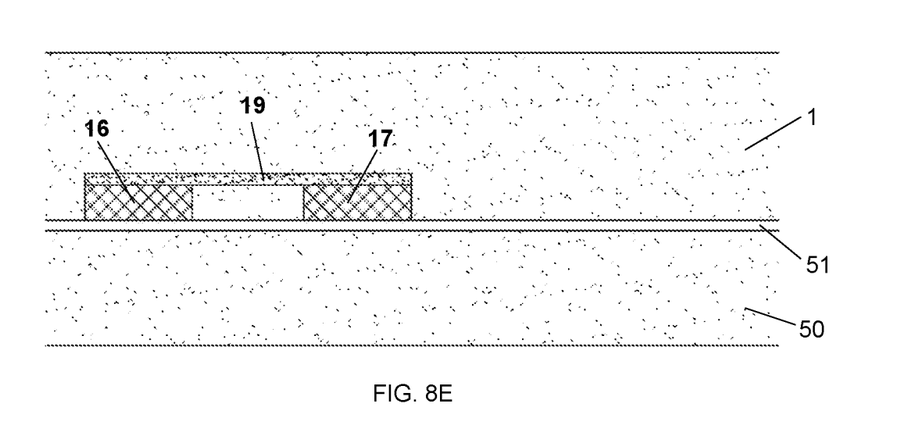
Figure 8F:
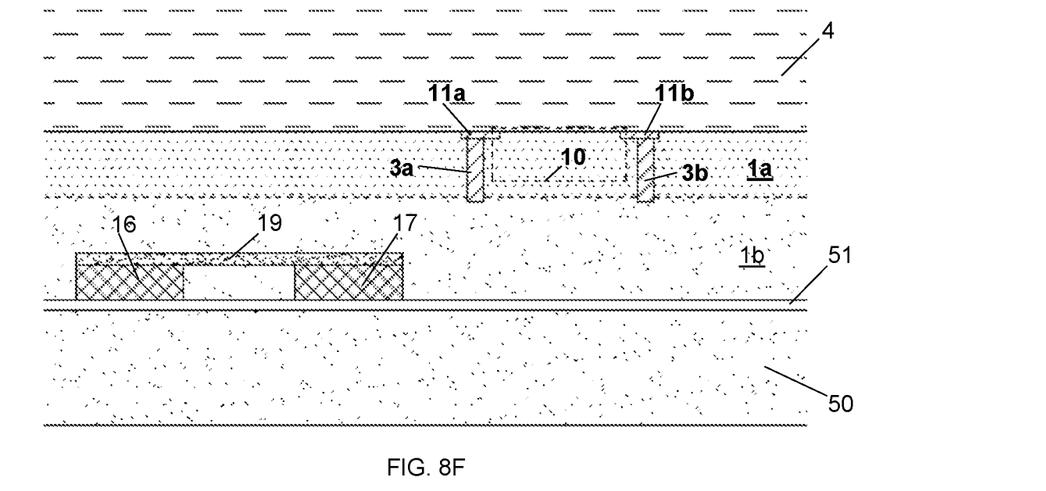
Figure 8G:
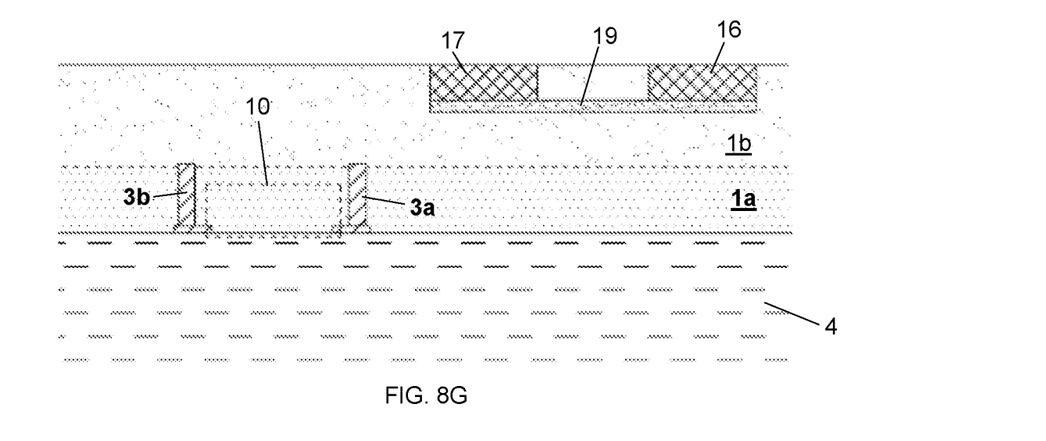
Figure 8H:
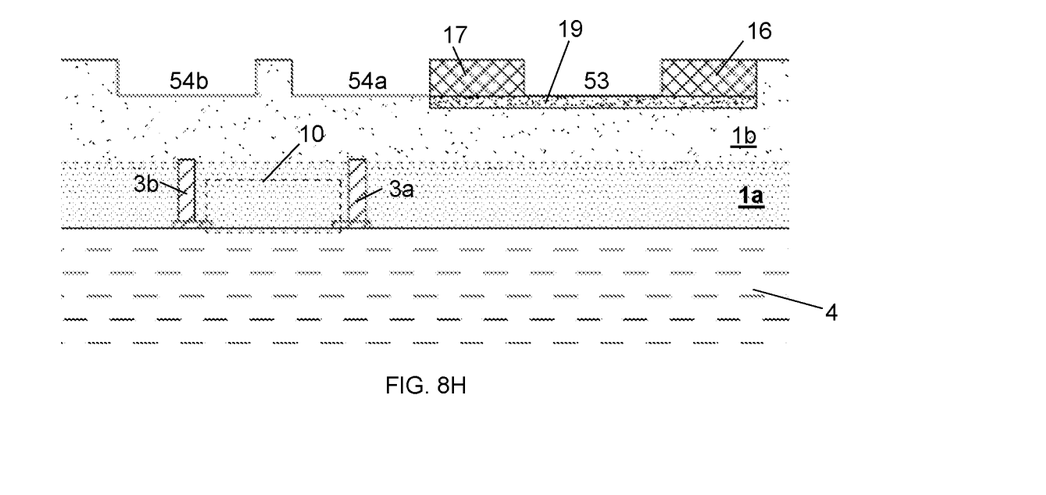
Figure 8I:
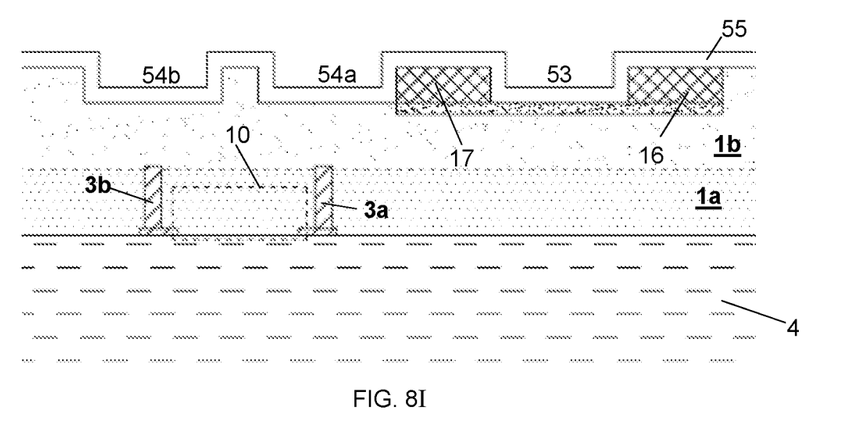
Figure 8J:
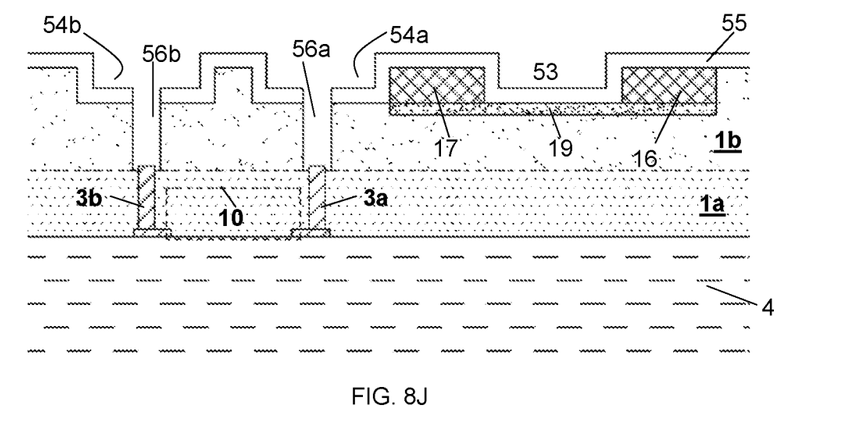
Figure 8K:
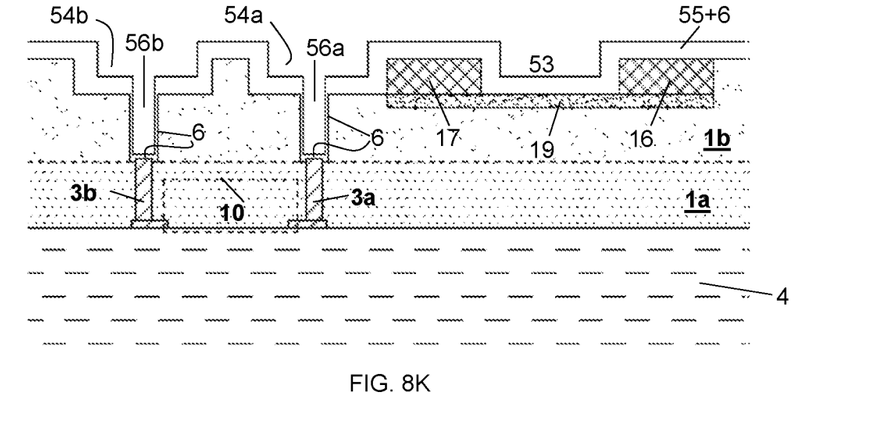
Figure 8L:
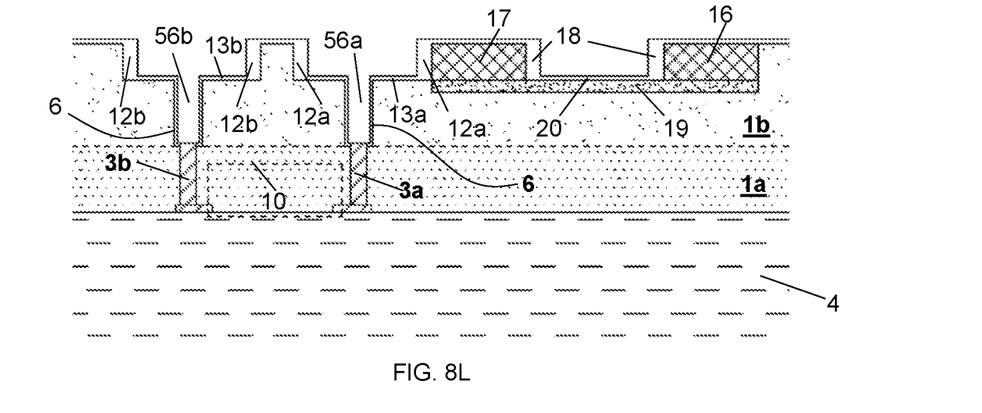
Figure 8M:
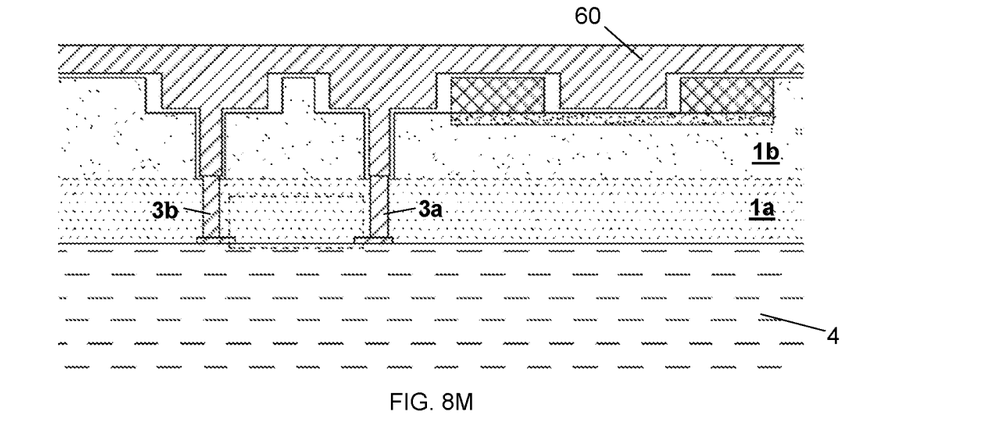
Figure 8N:
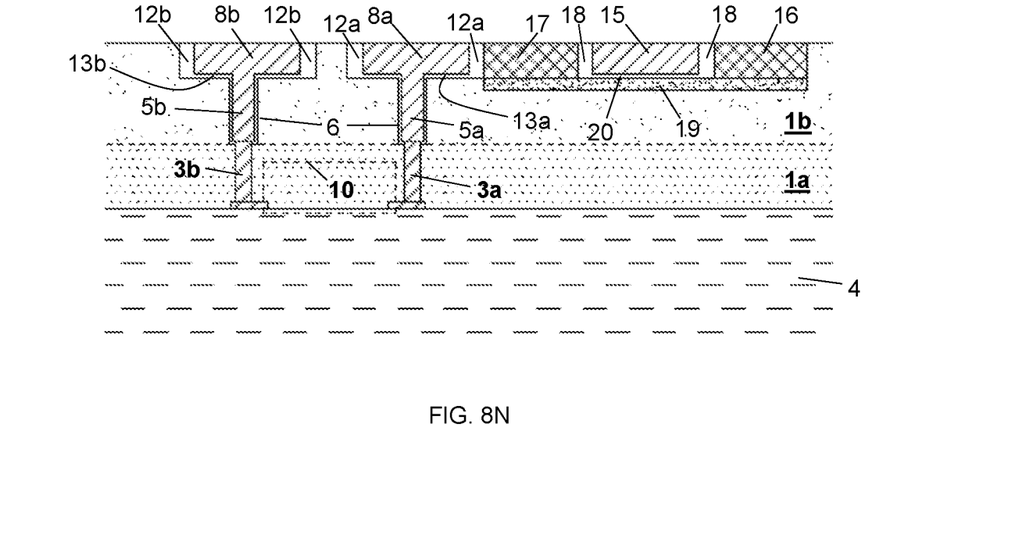
Figure 8O:
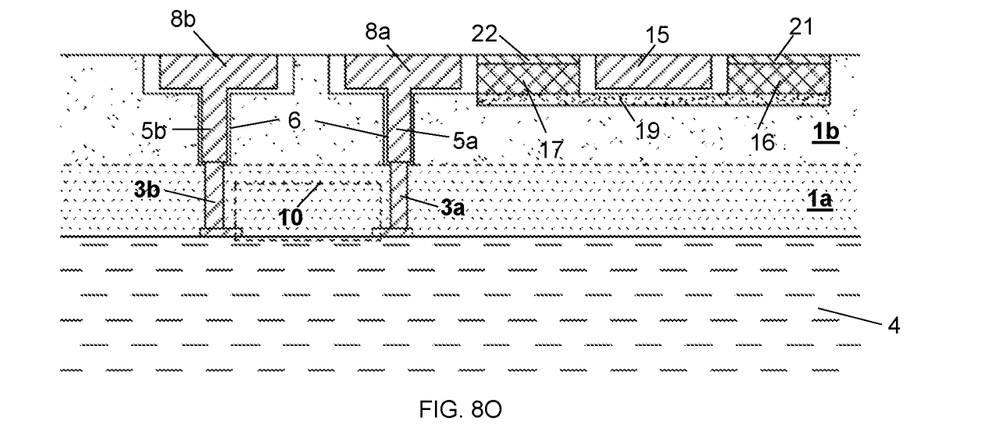
Figure 8P:
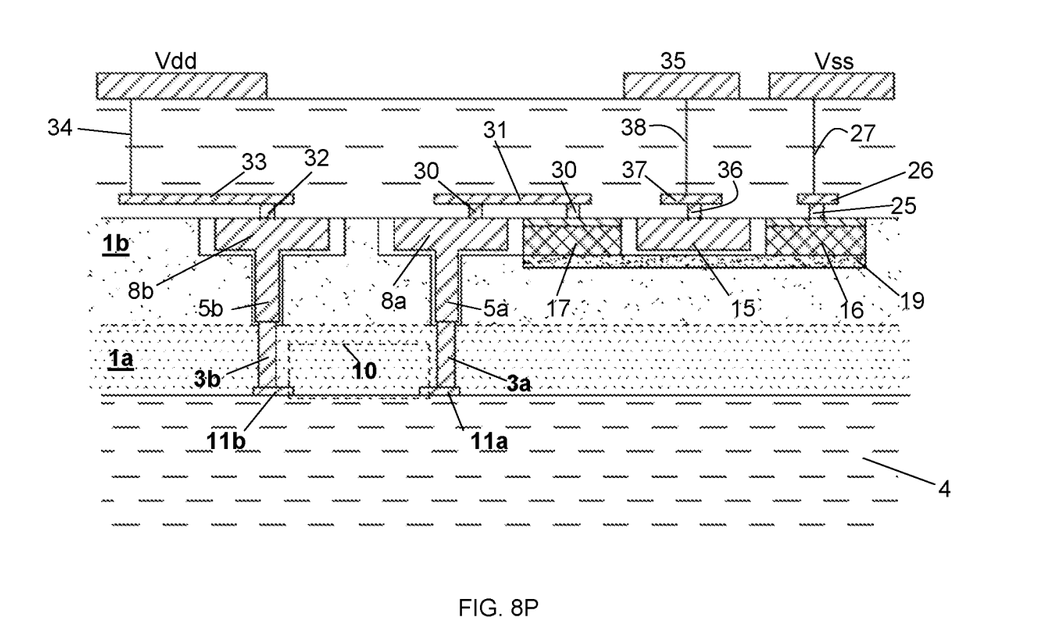

A method for producing the IC shown in FIG. 2 is described hereafter, with reference to FIGS. 8A to 8P. As seen in FIG. 8A, a silicon process wafer 50 is provided and a thin etch stop layer 51, for example a SiGe layer is produced on its surface by epitaxial growth. Again by epitaxial growth, a monocrystalline silicon layer 52 is produced on the SiGe layer 51. See FIG. 8B. The SiGe layer 51 may have a thickness of a few tens of nanometres. The epitaxial Si-layer 52 may have a thickness of about 100 nm. The Si-layer 52 may be subjected to a doping step (not shown) by implanting the complete layer with p-type doping elements, to turn the layer into a lightly p-doped layer. More preferably, the p-type doping is applied in situ during the epitaxial growth. Instead of the above method steps, an SOI (silicon on insulator) wafer could be taken as the starting point for the method. The insulator layer plays the part of the etch stop layer 51, the silicon layer on the insulator plays the part of the epitaxial layer 52.

An n-type dopant implant step is performed in two limited areas of the layer 52 (see FIG. 8C) by masking the wafer except in these limited areas, thereby creating two n-doped regions 16 and 17 which will become the source and drain areas shown in FIG. 2. Optionally, a further local p-type dopant implant step may be performed, for creating the p-doped region 19 of FIG. 2. See FIG. 8D. The dopant densities are in accordance with standard values for the creation of source/drain junctions of a MOS type field effect transistor. A first dopant activation anneal step may be performed at this point, to activate the dopant elements. Epitaxial growth of silicon is then continued, as illustrated in FIG. 8E, until the silicon substrate 1 is obtained on the SiGe layer 51. The substrate 1 has a thickness that may be in the order of 500 nm, P-type doping of the Si substrate 1 may be realized by in-situ doping during the epitaxy.

Any suitable processing steps for producing the FEOL portion 1a and the BEOL portion 4 of the chip are applied at the front surface. See FIG. 8F. The FEOL portion 1a includes the IC block 10 and at least two buried power rails: a first rail 3a destined to be coupled to the reference voltage Vss and a second rail 3b destined to be coupled to the supply voltage Vdd. The rails are connected to the IC block 10 via the local interconnects 11a and 11b. The process wafer 50 is then flipped and mounted on an auxiliary substrate (not shown), after which the process wafer 50 is removed by grinding and/or chemical mechanical polishing, and finally by a wet or dry (plasma) etch process, stopped by the etch stop layer 51. Removal of the latter results in the back side of the substrate 1 being exposed, as shown in FIG. 8G. The previously formed n-doped regions 16 and 17 are now exposed. The back side of the substrate is then patterned by lithography and etching, as illustrated in FIG. 8H, to create a plurality of openings, for producing the buried conductors of the first PDN level. Three openings 53, 54a and 54b are shown. The first opening 53 is situated between the n-doped regions 16 and 17 and extends down to the p-doped area 19. The sides of the opening 53 are directly adjacent to the n-doped regions 16 and 17 and the bottom of the opening is directly adjacent to the p-doped area 19. The position of the second opening 54a as seen in the plane of the substrate 1 is such that the second opening 54a fully overlaps the width of the buried rail 3a destined to be coupled to Vss. The third opening 54b overlaps the width of the buried rail 3b destined to be coupled to Vdd. The length of the first opening 53 (i.e., its dimension perpendicular to the plane of the drawing) will determine the length of the gate of the transistor. The length of the second and third opening 54a and 54b may be longer than the length of the first opening.

As shown in FIG. 8I, a layer 55 of silicon oxide is then deposited conformally on the back side of the substrate. The oxide layer 55 may be about 10 nm thick. The oxide layer 55 forms a liner on the sidewalls and the bottom of the openings 53, 54a and 54b. Using suitable lithography and etch techniques, via openings 56a and 56b are then etched, as shown in FIG. 8J, for producing the TSV connections between the buried rails and the backside PDN. Only two vias relevant for the disclosed technology are shown: the via 56a is etched through the bottom of the opening 54a and down to the buried rail 3a destined to be coupled to Vss, and the via 56b is etched through the bottom of the opening 54b and down to the buried rail 3b destined to be coupled to Vdd. This is followed by the conformal deposition of a thin silicon oxide layer 6, which forms a liner on the sidewalls and the bottom of the vias. See FIG. 8K. The oxide layer 6 increases the thickness of the previously deposited oxide layer 55. The liner 6 is then removed from the bottom of the TSV openings 56a and 56b by a suitable etch process, such as a maskless plasma etch process that creates a protective polymer layer on the sidewalls so that the oxide on the sidewalls is maintained while removing the liner from the bottom. See FIG. 8L. A suitable process of this type is described for example in European Patent No. EP3035369. The plasma etch process is continued until it thins the oxide layer 55 at the bottom of the openings 53, 54a and 54b down to a thickness that is suitable for making the remaining oxide layer 20 function as the gate oxide of the transistor. Like the liner 6 on the sidewalls of the vias, the oxide 18, 12a and 12b on the sidewalls of the openings 53, 54a and 54b maintains its thickness. After the removal of the protective polymer, the openings 53, 54a and 54b and the vias 56a and 56b are filled with a conductive material 60 (see FIG. 8M), for example a metal such as copper, such as by electroplating. The back surface is planarized (see FIG. 8N), until the substrate 1 is exposed, with the conductors 15, 8a and 8b buried in the substrate and accessible at the back of the substrate. The electroplating step has furthermore created the TSV connections 5a and 5b. TSV 5a is uniform with the contact pad 8a and TSV 5b is uniform with contact pad 8b. The metal pads 8a and 8b may have a higher length than the gate 15, and may in that case be uniform with multiple TSV connections colinear with the TSV connections 5a and 5b. TSV connections 5a and 5b are not necessarily located in the same vertical plane.

After this, silicidation of the surface of the exposed n-doped regions 16 and 17 is performed (see FIG. 8O), to produce the source and drain electrodes 21 and 22. This may be done in any suitable manner, wherein a silicide forming metal is first deposited on the entire surface, then patterned to leave the metal at least on the semiconductor material in the electrode areas 16 and 17, followed by silicidation through heating, and if necessary the removal of unreacted silicide forming metal. Suitable silicide forming metals are Ni, NiPt, Co or Ti.

After this, the backside PDN is produced by damascene-type techniques, creating multiple interconnect levels. As seen in FIG. 8P, the PDN 7 includes contact vias 32, 30, 36 and 25 and conductors 8b, 31, 37 and 26. After this, the remaining levels of the PDN are produced, including the Vdd, Vss terminals and the gate control terminal 35. The lines 9b, 38 and 27 symbolize the respective connections through these remaining levels, of the TSV 5b to the Vdd terminal, of the source electrode 21 to the Vss terminal, and of the gate electrode 15 to the gate control terminal 35.

Figure 9A:
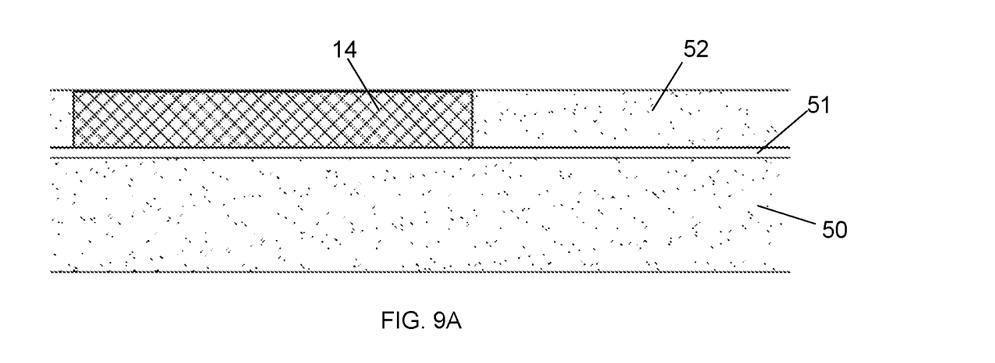
FIGS. 9A and 9B show the steps for creating the n-well and p-type doped regions, as applicable in a method for producing the transistor of FIG. 3.
Figure 9B:
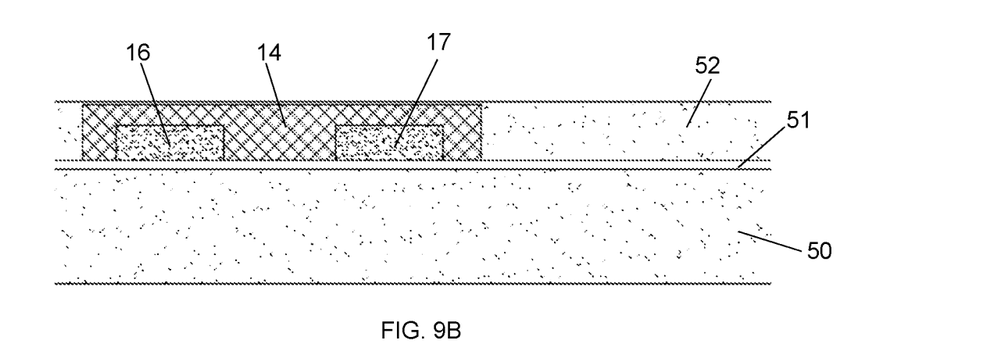

An example method for producing the p-type transistor of FIG. 3 includes the same method steps, except for the formation of the doped regions 16 and 17. In this case, an n-well 14 may first be created by implanting n-type dopant elements in the silicon layer 52, as illustrated in FIG. 9A. This is followed by two deep p-type implants for forming the source and drain regions 16 and 17 (FIG. 9B). Alternatively, the p-type implants 16 and 17 could be done prior to producing the n-well implant 14.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. An integrated circuit (IC) chip comprising:
 a semiconductor substrate, having a front side and a back side, the substrate comprising in a front portion of the substrate, a front end of line (FEOL) portion comprising a plurality of active devices;
 a back end of line (BEOL) portion, on top of the FEOL portion;
 a power delivery network (PDN) comprising one or more interconnect levels, a power supply terminal Vdd, and a reference terminal Vss, at least the power supply terminal Vdd and the reference terminal Vss being located at the back side of the substrate;
 a plurality of Through Substrate Via (TSV) connections through the substrate, the TSV connections configured to enable supply of power from the terminals Vss and Vdd at the back side of the substrate to the plurality of active devices at the front of the substrate; and
 at least one field effect transistor at the back side of the substrate, the at least one field effect transistor comprising a source region and a drain region, both located in the substrate, and a gate electrode between the source and drain regions, wherein the source and drain regions and the gate electrode are contacted at the back side of the substrate, and wherein the PDN further comprises a gate control terminal for controlling the gate voltage of the at least one field effect transistor, wherein one of the source and drain regions is electrically connected to the power supply terminal Vdd or the reference terminal Vss through one or more conductors of the one or more interconnect levels of the PDN, the one or more conductors being located at the back side of the substrate, while the other terminal is electrically connected to one or more of the plurality of active devices through the one or more conductors of the one or more interconnect levels of the PDN and through one or more of the plurality of TSV connection, wherein the entire PDN is located at the back side of the substrate, and wherein the FEOL portion comprises a plurality of buried rails, which connect the plurality of active devices to the plurality of TSV connections, and wherein the plurality of buried rails are connected through the plurality of TSV connections and through the PDN, to the power supply terminal Vdd or to the reference terminal Vss.

2. The IC chip according to claim 1, wherein the gate electrode is buried in the substrate at the back side thereof and separated from the source and drain regions by a dielectric layer.

3. The IC chip according to claim 2, wherein a plurality of conductors of a first PDN interconnect level are buried in the substrate at the back side thereof, and wherein each of the plurality of conductors is uniform with one or more TSV connections.

4. The IC chip according to claim 1 comprising an array of the plurality of buried rails which are alternately connected to the voltage supply terminal Vdd and to the reference terminal Vss, and wherein the at least one field effect transistor is integrated in a space between two rails of the array.

5. The IC chip according to claim 1, further comprising a block of the plurality of active devices coupled to the PDN through the plurality of TSV connections, and wherein the at least one field effect transistor is configured to act as a header transistor or a footer transistor for allowing or interrupting the supply of power to the block.

6. The IC chip according to claim 5, comprising both a header transistor and a footer transistor for allowing or interrupting the supply of power to the block.

7. A method of producing an IC chip in accordance with claim 1, comprising:
 providing a process wafer, comprising a first layer of semiconductor material on a surface of the process wafer;
 implanting dopant elements into the first layer of semiconductor material, to form the source and drain regions of the at least one field effect transistor;
 depositing a further layer of the semiconductor material on the first layer, to obtain the substrate on the process wafer, the substrate consisting of the first layer, including the source and drain regions, and the further layer;
 producing the FEOL portion in the front portion of the substrate, at a side of the substrate opposite from the process wafer;
 producing the BEOL portion on top of the FEOL portion;
 removing the process wafer, to thereby expose the source and the drain regions at the back side of the substrate;
 etching openings from the back side of the substrate and through the substrate for the TSV connections;
 depositing a dielectric liner on sidewalls and a bottom of the openings for the TSV connections;
 by a maskless etching process, removing the dielectric liner from the bottom of the TSV openings;
 producing an electrically conductive layer on the substrate, filling the TSV openings to thereby form the TSV connections;
 planarizing the electrically conductive layer;
 producing the power supply and reference terminals Vdd and Vss of the PDN;
 forming source and drain electrodes on the exposed source and drain regions; and
 forming a gate electrode and a gate dielectric at the back side of the substrate, wherein the entire PDN is located at the back side of the substrate, wherein the FEOL portion comprises a plurality of buried rails, and wherein the TSV connections and the PDN connect each of the plurality of buried rails to either the voltage supply terminal Vdd or the reference terminal Vss.

8. The method according to claim 7, further comprising, after exposing the source and drain regions at the back side of the substrate and before etching the openings for the TSV connections:
 etching an opening at the back side of the substrate between the source and drain regions, two sidewalls of the opening being directly adjacent the source and drain regions, followed by:
 depositing a dielectric layer conformally on the back side of the substrate, wherein forming the gate electrode and the gate dielectric comprises:
- the maskless etching process thins the conformal dielectric layer on the bottom of the opening between the source and drain regions, to obtain a thin dielectric layer on the bottom of the opening, the layer being thinner than the dielectric layer that remains on the sidewalls of the opening,
- the electrically conductive layer fills the opening between the source and drain regions, and
- the planarization of the electrically conductive layer forms the gate electrode, separated from the substrate by the dielectric layer on the sidewalls of the opening and by the thin dielectric layer on the bottom of the opening, that thereby forms the gate dielectric of the at least one field effect transistor.

9. The method according to claim 8, further comprising etching of additional openings at the back side of the substrate, simultaneously with the etching of the opening between the source and drain regions, and wherein:
- the TSV openings are etched through the bottom of the additional openings,
- the conformal dielectric layer and the liner are also deposited on the bottom and sidewalls of the additional openings,
- the maskless etching process results in a thin dielectric layer on the bottom of the additional openings while obtaining a thicker dielectric layer on the sidewalls of the additional openings, and
- the electrically conductive layer fills the TSV openings as well as the additional openings, thereby forming conductors of a first PDN interconnect level, which are buried in the substrate and which are uniform with one or more TSV connections, the conductors being isolated from the substrate by the thin dielectric layers at the bottom of the additional openings and by the thicker dielectric layers on the sidewalls of the additional openings.

10. An integrated circuit (IC) chip comprising:
- a semiconductor substrate, having a front side and a back side, the substrate comprising in a front portion of the substrate, a front end of line (FEOL) portion comprising a plurality of active devices;
- a back end of line (BEOL) portion, on top of the FEOL portion;
- a power delivery network (PDN) comprising one or more interconnect levels, a power supply terminal Vdd, and a reference terminal Vss, at least the power supply terminal Vdd and the reference terminal Vss being located at the back side of the substrate;
- a plurality of Through Substrate Via (TSV) connections through the substrate, the TSV connections configured to enable supply of power from the terminals Vss and Vdd at the back side of the substrate to the plurality of active devices at the front of the substrate;
- at least one field effect transistor at the back side of the substrate, the at least one field effect transistor comprising a source region and a drain region, both located in the substrate, and a gate electrode between the source and drain regions, wherein the source and drain regions and the gate electrode are contacted at the back side of the substrate, and wherein the PDN further comprises a gate control terminal for controlling the gate voltage of the at least one field effect transistor, wherein one of the source and drain regions is electrically connected to the power supply terminal Vdd or the reference terminal Vss through one or more conductors of the one or more interconnect levels of the PDN, the one or more conductors being located at the back side of the substrate, while the other terminal is electrically connected to one or more of the plurality of active devices through the one or more conductors of the one or more interconnect levels of the PDN and through one or more of the plurality of TSV connections; and
- a block of the plurality of active devices coupled to the PDN through the plurality of TSV connections, wherein the at least one field effect transistor is configured to act as a header transistor or a footer transistor for allowing or interrupting the supply of power to the block.

11. The IC chip according to claim 10, further comprising both a header transistor and a footer transistor for allowing or interrupting the supply of power to the block.

* * * * *